United States Patent
Kim et al.

(10) Patent No.: US 6,865,116 B2
(45) Date of Patent: Mar. 8, 2005

(54) CLAMP CIRCUIT AND BOOSTING CIRCUIT USING THE SAME

(75) Inventors: Dae Han Kim, Ichon-Shi (KR); Yi Jin Kwon, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/329,529

(22) Filed: Dec. 27, 2002

(65) Prior Publication Data

US 2004/0012430 A1 Jan. 22, 2004

(30) Foreign Application Priority Data

Jul. 18, 2002 (KR) .................... 10-2002-0042156

(51) Int. Cl.$^7$ ................................ G11C 7/00
(52) U.S. Cl. ................. 365/189.08; 327/536
(58) Field of Search ............ 365/189.06–189.09, 365/189.11; 327/530, 536, 108, 309, 333

(56) References Cited

U.S. PATENT DOCUMENTS

| | | | | | |
|---|---|---|---|---|---|
| 6,111,449 | A | * | 8/2000 | Tobita | 327/327 |
| 6,492,862 | B2 | * | 12/2002 | Nakahara | 327/536 |
| 6,545,917 | B2 | * | 4/2003 | Kim | 365/189.08 |
| 6,577,514 | B2 | * | 6/2003 | Shor et al. | 327/536 |

* cited by examiner

*Primary Examiner*—Dinh T. Le
(74) *Attorney, Agent, or Firm*—Mayer, Brown, Rowe & Maw LLP (57) ABSTRACT

The present invention relates to a clamp circuit and a boosting circuit using the same. In order to drop a boosting voltage to a target word line voltage, at least one or more clamp circuit is provided. At least one or more of the clamp circuits are independently driven in a desired sensing period to lower the boosting voltage. Thus, rapid read access time is accomplished upon a data read operation. Current consumption can be minimized and a stabilized word line voltage can be generated.

13 Claims, 6 Drawing Sheets

CLAMP CIRCUIT AND BOOSTING CIRCUIT USING THE SAME

BACKGROUND OF THE INVENTION

1. Field of the Invention

The invention relates generally to a clamp circuit and a boosting circuit using the same. More particularly, the invention relates to a clamp circuit and a boosting circuit using the same, capable of reducing read access time upon a data read operation of a memory cell in the semiconductor device, minimizing current loss and generating a stabilized word line voltage.

2. Description of the Prior Art

In the memory cell of EEPROM (electrically erasable and programmable read only memory), being a family of non-volatile semiconductor memory devices, a program operation is performed by which electrons are accumulated at the floating gate electrode. A data read operation is performed by which variation in the threshold voltage (Vth) depending on whether the electrons exist or not is detected. A flash EEPROM (hereinafter called 'flash memory device') for performing the erase operation for data over the entire memory cell array and the erase operation for data in a block unit by dividing the memory cell array into given blocks is provided in the EEPROM.

Figure 9:
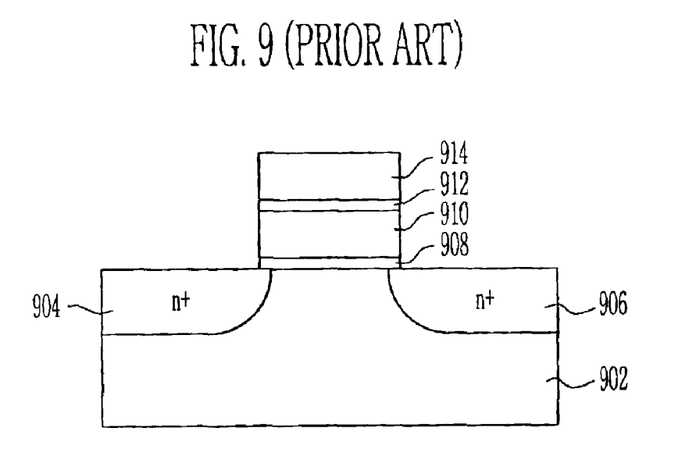
FIG. 9 is a cross-sectional view of a common flash memory device.

Generally, the memory cell of the flash memory device may be classified into a stack gate type and a split gate type depending on its structure. For example, as shown in FIG. 9, the stack gate type memory cell includes a source region 904 and a drain region 906 formed at a semiconductor substrate 902, and a gate oxide film 908, a floating gate 910, a dielectric film 912 and a control gate 914, which are sequentially formed on the semiconductor substrate 902.

Figure 10:
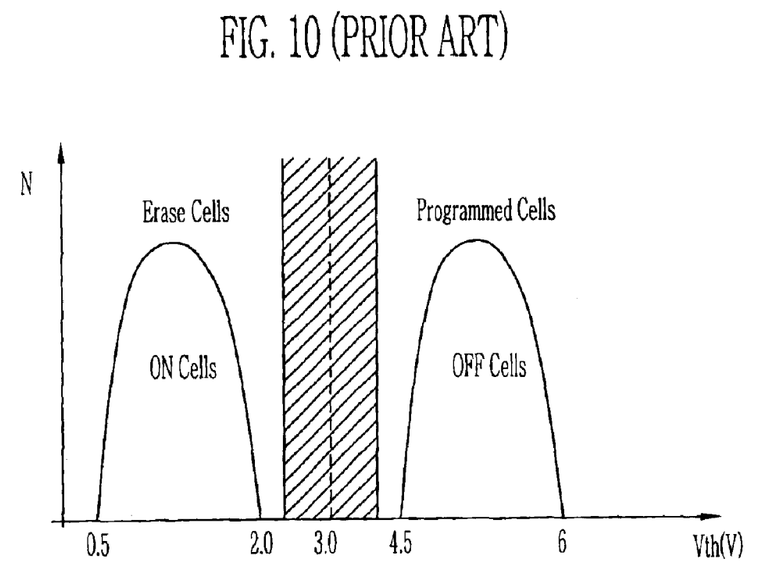
FIG. 10 is a graph illustrating distribution of the threshold voltage of the memory cell depending on program and erase operations of the common flash memory device.

In the program operation of the stack gate type memory cell, as shown in Table 1 below and FIG. 10, a source voltage (Vs) and a bulk voltage (Vb), being a ground potential (0V), are applied to the source region 904 and the semiconductor substrate 902 (i.e., bulk), respectively, a gate voltage (Vg) of a positive high voltage (program voltage, +9V~+10V) is applied to the control gate 914, a drain voltage (Vd) (for example, +5V~+6V) is applied to the drain region 906, so that hot carriers are generated. In more detail, these hot carriers are generated since the electrons in the bulk are accumulated at the floating gate 910 by an electric field of the gate voltage (Vg) applied to the control gate 914 and electric charges supplied to the drain region 906 are thus accumulated. If the program operation is completed, the memory cells have a program threshold voltage of a target program voltage distribution (for example, 6V~7V).

Meanwhile, in the erase operation of the stack gate type memory cell, as in Table 1 below, a negative high voltage (erase voltage, for example -9V~-10V) is applied to the control gate 914 and the bulk voltage (Vb) (for example +5V~+6V) is applied to the bulk, so that a F-N (Fowler-Nordheim) tunneling phenomenon is caused. The memory cells are erased in a sector unit sharing the bulk region. The electrons accumulated at the floating gate 908 are discharged toward the source region 904 by means of the F-N tunneling phenomenon, so that the memory cells have erase threshold voltages of given voltage distribution (far example, 1V~3V).

The memory cells of which the threshold voltages are increased by the program operation are turned off since injection of current from the drain region 906 to the source region 904 is prevented upon the read operation. Further, the memory cells of which the threshold voltages are lowered by the erase operation are turned on since current is injected from the drain region 906 to the source region 904.

The flash memory cells are constructed to share the bulk region for higher integration in constructing the flash memory array. Accordingly, the flash memory cells contained in a single sector are erased at the same time. At this time, if all the flash memory cells in the sector are erased a,t the same time, there exist flash memory cells having the threshold voltages of below '0V' (hereinafter called 'over-erased memory cell') among the flash memory cells due to uniformity against the threshold voltage of each of the flash memory cells. In order to compensate for this, a series of over-erase repair operations by which the threshold voltages of the over-erased flash memory cells are distributed into the erased threshold voltage distribution, are performed. This over-erase repair operation is performed by applying the gate voltage (Vg) (for example +3V) to the control gate 914, applying the drain voltage (Vd) (for example +5~+6V) to the drain region 906 and making grounded the source region 904 and the bulk, as shown in Table 1 below.

TABLE 1

| Operating Mode | Gate Voltage (Vg) | Drain Voltage (Vd) | Source Voltage (Vs) | Bulk Voltage (Vb) |
| --- | --- | --- | --- | --- |
| Program Operation | +9 V~+10 V | +5 V~+6 V | 0 V | 0 V |
| Erase Operation | -7 V~-8 V | Floating | Floating | +8 V~+9 V |
| Over-Erase Correction Operation | +0 V | +5 V~+6 V | 0 V | 0 V |
| Read Operation | +3.5~+4.5 V | +1 V | 0 V | 0 V |

As described above, in order for the program operation, the erase operation and the read operation of the flash memory device to operate, the function of the high-voltage generator for generating high voltages (for example, Vpgm (program voltage), Vera (erase voltage) and Vrea (read voltage)) supplied to the control gate of the memory cell is very important. Recently, as there is a trend that all the semiconductor memory devices are driven by a low voltage, it is also required that the flash memory devices be driven under an ultra low voltage (for example, below 2V or below 1.7V). On this trend, in order to maintain a rapid operating speed of the flash memory device, the function of the high-voltage generator is very important.

Of the high-voltage generators, in particular, the read voltage generator for generating the read operation voltage includes a bootstrap circuit for increasing the read operation speed. Such a bootstrap circuit boosts a low-potential power supply voltage over the voltage to supply the boosted voltage to the word line through the row decoder. In case where the low-potential power supply voltage is boosted using the bootstrap circuit, if the word line voltage boosted by the bootstrap circuit is too low, it is difficult to exactly read out current of the memory cell. If the word line voltage is too high, there is a problem in data retention characteristic since stress is applied to the control gate of the memory cell.

In the above, in order to solve the latter, a clamp circuit for dropping the voltage that is too high boosted (hereinafter called 'boosting voltage') by the bootstrap circuit down to a target voltage is positioned at the rear end of the bootstrap circuit. The mentioned clamp circuit will be described by reference to FIG. 11.

Figure 11:
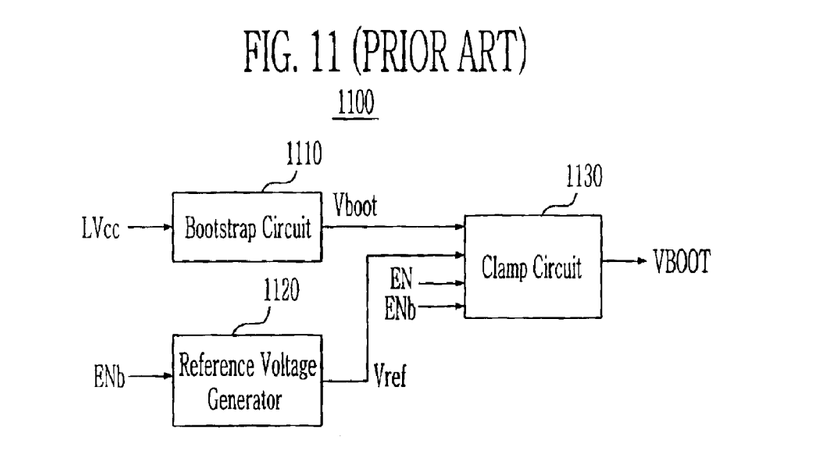
FIG. 11 is a block diagram of a common boosting circuit.

FIG. 11 is a block diagram of the boosting circuit in the common flash memory device.

Referring to FIG. 11, a boosting circuit 1100 includes a bootstrap circuit 1110, a reference voltage generator 1120 and a clamp circuit 1130. The bootstrap circuit 1110 receives a low-potential power supply voltage (LVcc) or a high-potential power supply voltage (HVcc) and boosts the voltage over the value of the voltage. The reference voltage generator 1120 is driven by an enable bar signal (ENb) being a synchronizing signal to output a reference voltage (Vref). The clamp circuit 1130 are driven by an enable signal (EN) and the enable bar signal (ENb) to compare the boosting voltage (Vboot) outputted from the bootstrap circuit 1110 and the reference voltage (Vref) outputted from the reference voltage generator 1120. As the result of the comparison, if the boosting voltage (Vboot) is higher than a target voltage, the clamp circuit 1130 drops the boosting voltage (Vboot) down to the target voltage and then outputs the final word line voltage (VBOOT).

Figure 12:
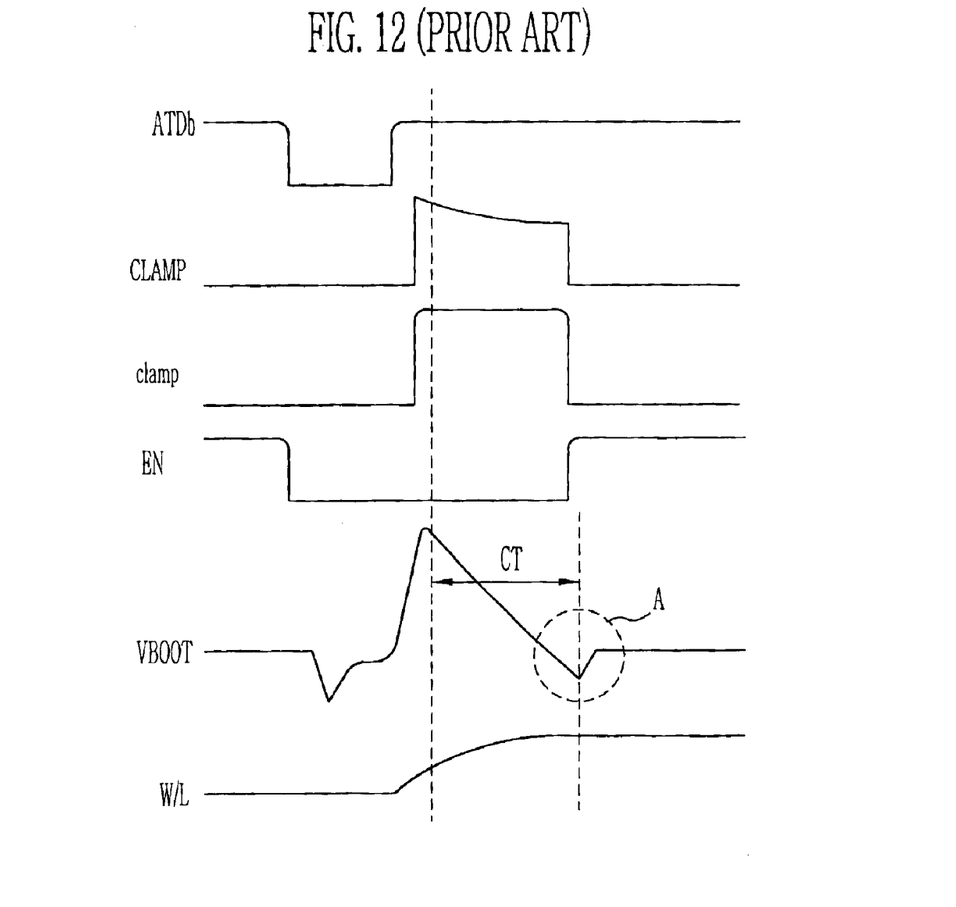
FIG. 12 shows a waveform for explaining the operating characteristics of the boosting circuit shown in FIG. 11.

However, such a boosting circuit 1100 includes one clamp circuit 1130 (that is, one clamp circuit that corresponds to one bootstrap circuit and is used to drop the boosting voltage (Vboot) outputted from one bootstrap circuit) in order to generate the word line voltage (VBOOT). Accordingly, access time (i.e., time taken to drop the boosting voltage down to the target voltage) taken to generate a stable word line voltage (VBOOT) is lengthened. Furthermore, in order to solve this problem, the word line voltage (VBOOT) is under shoot (see 'A' in FIG. 12) in case where a rapid access time is considered. Due to this, there occur many problems in stabilizing the semiconductor devices. In addition, there is a problem that read active current is not still controlled at the low-potential power supply voltage (LVcc) region wherein sensing is not performed at the clamping period.

SUMMARY OF THE INVENTION

The present invention is contrived to solve the above problems and an object of the present invention is directed to provide a boosting circuit capable of generating a rapid and stabilized word line voltage upon a data read operation.

In order to accomplish the above object, a boosting circuit comprising a bootstrap circuit for boosting a first voltage to output a second voltage: a reference voltage generator for generating a reference voltage;: and a clamp circuit unit including at least one or more clamp circuit, each of the clamp circuits comparing the second voltage and the reference voltage, at least one of the clamp circuits being driven to drop the second voltage to a target voltage, and the claim circuit comprising a voltage divider receiving a first voltage, for dividing the first voltage, a comparator receiving a reference voltage, for comparing the reference voltage and a divided voltage that is divided in the voltage divider, wherein when the divided voltage is higher than the reference voltage, the comparator outputs a first signal and when the divided voltage is lower than the reference voltage, the comparator outputs a second signal having an opposite phase to the first signal, and a voltage drop unit for dropping the first voltage to a second voltage wherein the voltage drop unit is driven by the first signal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 1:
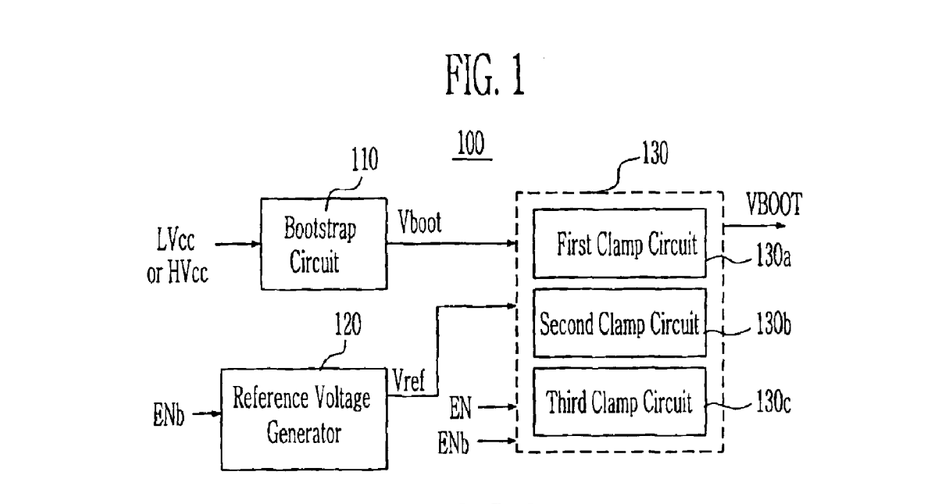
FIG. 1 is a block diagram of a boosting circuit according to a preferred embodiment of the present invention.

FIG. 1 is a block diagram of a boosting circuit according to a preferred embodiment of the present invention.

Referring to FIG. 1, the boosting circuit 100 according to the preferred embodiment of the present invention comprises a bootstrap circuit 110, a reference voltage generator 120 and a clamp circuit unit 130. The clamp circuit unit 130 includes at least one clamp circuit, for example, a first clamp circuit 130a, a second clamp circuit 130b and a third clamp circuit 130c. At this time, the number of the clamp circuit constituting the clamp circuit unit 130 may be different (increased or reduced) depending on the amount of the boosting voltage (Vboot) outputted from the bootstrap circuit 110 and considering stabilization of the word line voltage (VBOOT).

Figure 2:
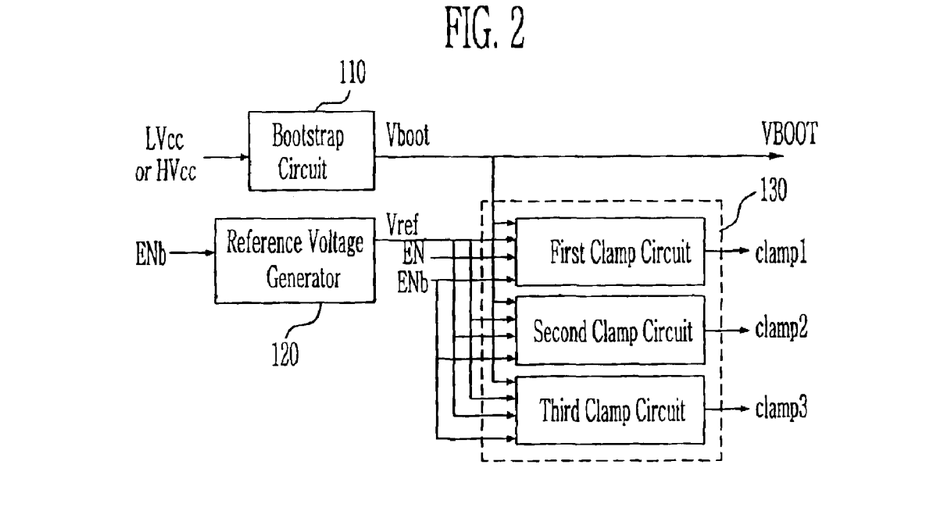
FIG. 2 is a detailed circuit diagram of the boosting circuit shown in FIG. 1.

In concrete, the clamp circuit unit 130 receives the boosting voltage (Vboot) outputted from the bootstrap circuit 110 and the reference voltage (Vref) outputted from the reference voltage generator 120 and compares the two voltages (Vboot, Vref), as shown in FIG. 2. As the result of the comparison, if the boosting voltage (Vboot) is higher than the reference voltage (Vref), the clamp circuit unit 130 drives at least one of the first clamp circuit~the third clamp circuit 130a~130c depending on difference in the voltages to drop the boosting voltage (Vboot). As such, if the boosting voltage (Vboot) is higher than the reference voltage (Vref), at least one of the first clamp circuit~the third clamp circuit 130a~130c is differentially driven depending on the amount of difference in the voltage between the boosting voltage (Vboot) and the reference voltage (Vref).

For example, the clamp circuit unit 130 may drive all the first clamp circuit~the third clamp circuit 130a~130c in order to rapidly drop the boosting voltage (Vboot) down to a target word line voltage (VBOOT) if difference in the voltage between the boosting voltage (Vboot) and the reference voltage (Vref) is large. Meanwhile, if difference in the voltage between the boosting voltage (Vboot) and the reference voltage (Vref) is small, the clamp circuit unit 130 may drive at least one of the first clamp circuit~the third clamp circuit 130a~130c. As such, a means for independently driving at least one of the first clamp circuit~the third clamp circuit 130a~130c depending on difference in the voltage between the boosting voltage (Vboot) to and the reference voltage (Vref) may be implemented by differently setting the values of the resistors R1 and R2 or the capacitors C1 and C2 in the voltage dividers 410 and 510 shown in FIG. 4 and FIG. 5 depending on the clamp circuits 130a~130c. Detailed explanation on this will be described in detail by reference to FIG. 4 and FIG. 5.

Figure 3:
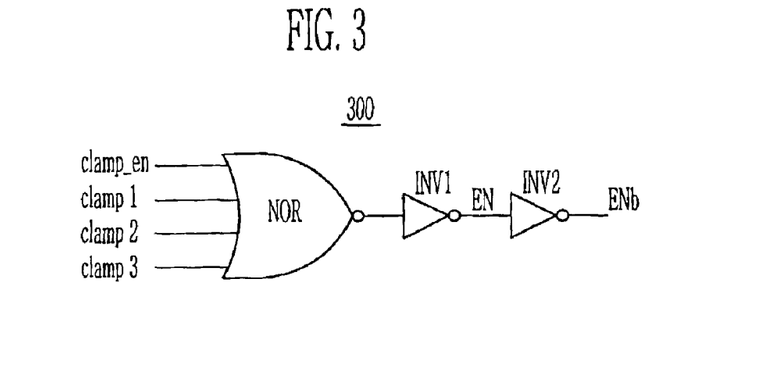
FIG. 3 shows an enable signal generator for generating the enable signal (EN) shown in FIG. 1 and FIG. 2.

Meanwhile, the enable signal (EN) and the enable bar signal (ENb), for synchronizing each of the clamp circuits 130a~130c in the clamp circuit unit 130, are generated by an enable signal generator 300 shown in FIG. 3. At this time, the enable signal generator 300 includes an NOR gate NOR for performing a negation logical sum of the clamp enable signal (clamp_en) and each of the clamp signals (clamp1~clamp3) of the clamp circuits 130a~130c, an inverter INV1 for inverting the output signal of the NOR gate NOR and an inverter INV2 for inverting the output signal (i.e., enable signal (EN)) of the inverter INV1 to output the enable bar signal (ENb). Such an enable signal generator 300 serves to reduce the read active current. It is possible to activate the enable signal (EN) only in the sensing period since the enable signal generator 300 logically combines the clamp enable signal (clamp_en) and each of the clamp signals (clamp1~clamp3) to generate the enable signal (EN). Accordingly, this is because the enable signal (EN) is controlled to drive each of the clamp circuits 130a~130c, which will be described in detail later.

In the above, it was described that the enable signal generator 300 logically combines the clamp enable signal (clamp_en) and each of the clamp signals (clamp1~clamp3) of the clamp circuits 130a~130c using the NOR gate NOR. However, it should be noted that this is only one example but other gates (NAND gate, AND gate, OR gate, etc.) may be used. In this case, this can be implemented by adequately adjusting the number of the inverters at the rear end constituting the enable signal generator 300 or adequately adjusting the circuit construction of the level shifters LSH1~LHS4 shown in FIG. 4 and FIG. 5.

Figure 4:
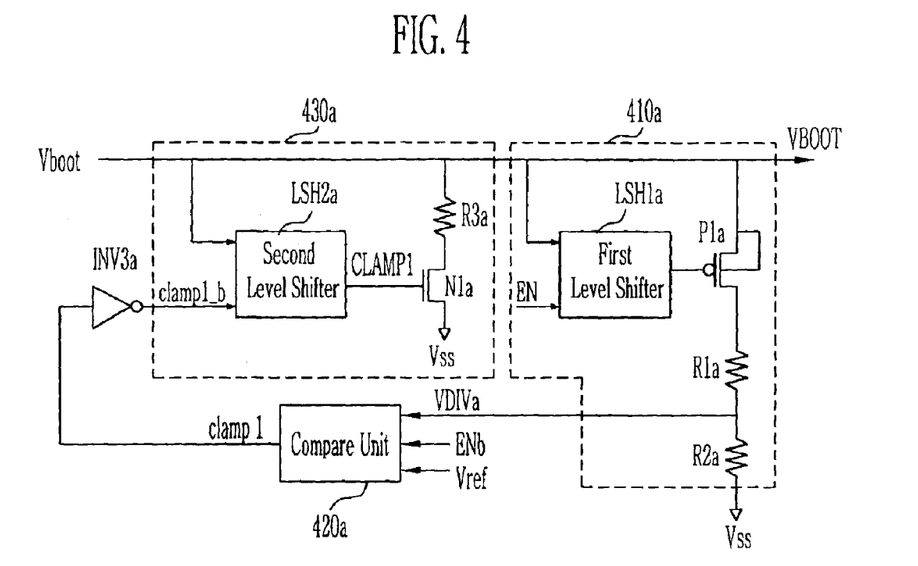
FIG. 4 is a detailed circuit diagram of the clamp circuit shown in FIG. 1 and FIG. 2 according to a first embodiment of the present invention.
Figure 5:
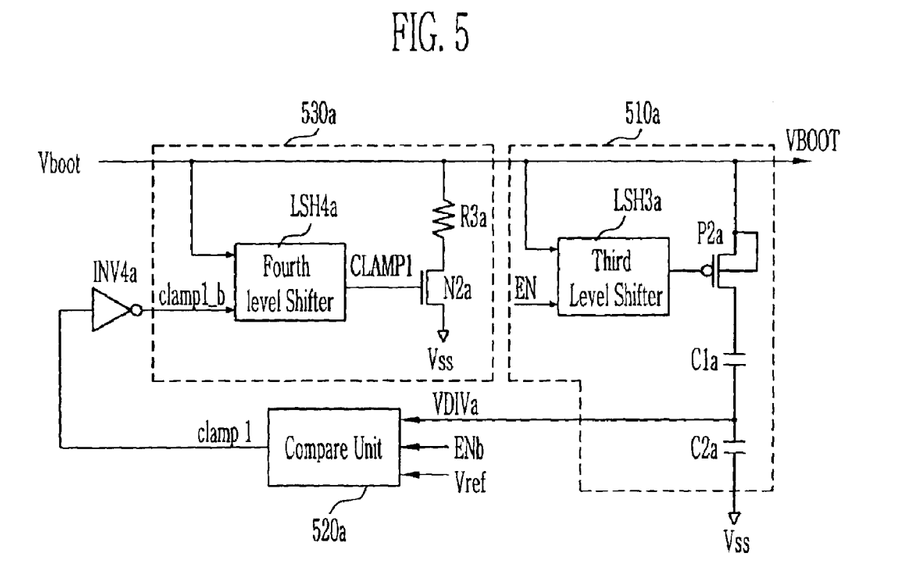
FIG. 5 is a detailed circuit diagram of the clamp circuit shown in FIG. 1 and FIG. 2 according to a second embodiment of the present invention.

Hereinafter, the clamp circuits 130a~130c constituting the clamp circuit unit 130 shown in FIG. 1 and FIG. 2 will be described in detail by reference to FIG. 4 and FIG. 5. A construction of each of the clamp circuits 130a~130c shown in FIG. 4 and FIG. 5 is same except for the values of the resistors R1a and R2a or the capacitors C1a and C2a provided in the voltage dividers 410a~410c or 510a~510c. For convenience of explanation, only the first clamp circuit 130a will be described. Further, the second clamp circuit 130b (not shown) includes a voltage divider 410b, a comparator 420b and a voltage drop unit 430b, and the third clamp circuit 130c includes a voltage divider 410c, a comparator 420c and a voltage drop unit 430c.

FIG. 4 is a detailed circuit diagram of the clamp circuit 13a according to a first embodiment of the present invention and FIG. 5 is a detailed circuit diagram of the clamp circuit 13a according to a second embodiment of the present invention.

Referring to FIG. 4, the first clamp circuit 13a according to the first embodiment of the present invention comprises a voltage divider 410a, a comparator 420a and a voltage drop unit 430a. The voltage divider 410a divides the boosting voltage (Vboot) of the bootstrap circuit (see '110' in FIG. 1) into a voltage of a given amount to output a divided voltage (VDIVa). The comparator 420a is synchronized by the enable bar signal (ENb) and compares the divided voltage (VDIVa) of the voltage divider 410a and the reference voltage (Vref) of the reference voltage generator (see '120' in FIG. 1) to output the clamp signal (clamp1). The voltage drop unit 430a serves to pass the boosting voltage (Vboot) to the ground terminal (Vss) according to the clamp signal (clamp1) to drop the boosting voltage (Vboot) to a target word line voltage (VBOOT).

In order to implement the above operation, the voltage divider 410a includes a PMOS transistor P1a, the resistor R1a and the resistor R2a, which are serially connected between the output terminal of the bootstrap circuit 110 and the ground terminal (Vss), and a level shifter LSH1a synchronized by the enable signal (EN) to turn on the PMOS transistor P1a. In other words, the PMOS transistor P1a is connected between the output terminal of the bootstrap circuit 110 and the resistor R1a and is turned on by the level shifter LSH1a. Further, the resistor R1a is connected between the PMOS transistor P1a and the resistor R2a, and the resistor R2a is connected between the resistor R1a and the ground terminal (Vss). The level shifter LSH1a is synchronized by the enable signal (EN) and is connected between the output terminal of the bootstrap circuit 110 and the gate electrode of the PMOS transistor P1a.

Furthermore, the voltage drop unit 430a includes a resistor R3a and a NMOS transistor N1a both of which are serially connected between the output terminal of the bootstrap circuit 110 and the ground terminal (Vss), and a level shifter LSH2a synchronized by the clamp signal bar (clamp1_b) being an inverse signal of the clamp signal (clamp1) to turn on the NMOS transistor N1a. In other words, the resistor R3a is connected between the output terminal of the bootstrap circuit 110 and the NMOS transistor N1a. The NMOS transistor N1a is connected between the resistor R3a and the ground terminal (Vss) and is turned on by the level shifter LSH2a. The level shifter LSH2a is synchronized by the clamp signal bar (clamp1_b) and is connected between the bootstrap circuit 110 and the gate electrode of the NMOS transistor N1a. At this time, it should be noted that the resistor R3a is not a necessarily required component but may be omitted.

Referring to FIG. 5, the first clamp circuit 130a according to the second embodiment of the present invention comprises a voltage divider 510a, a comparator 520a and a voltage drop unit 530a. The voltage divider 51a divides the boosting voltage (Vboot) of the bootstrap circuit (see '110' in FIG. 1) into a voltage of a given amount to output a divided voltage (VDIVa). The comparator 520a is synchronized by the enable bar signal (ENb) and compares the divided voltage (VDIVa) of the voltage divider 510a and the reference voltage (Vref) of the reference voltage generator (see '120' in FIG. 1) to output the clamp signal (clamp1). The voltage drop unit 530a serves to pass the boosting voltage (Vboot) to the ground terminal (Vss) according to the clamp signal (clamp1) to drop the boosting voltage (Vboot) to a target word line voltage (VBOOT).

In order to implement the above operation, the voltage divider 510a includes a PMOS transistor P2a, a capacitor C1a and a capacitor C2a, which are serially connected between the output terminal of the bootstrap circuit 110 and the ground terminal (Vss), and a level shifter LSH3a for turning on the PMOS transistor P2a. In other words, the PMOS transistor P2a is connected between the output terminal of the bootstrap circuit 110 and the capacitor C1a and is turned on by the level shifter LSH3a. Further, the capacitor C1a is connected between the PMOS transistor P2a and the capacitor C2a, and the capacitor C2a is connected between the capacitor C1a and the ground terminal (Vss). The level shifter LSH3a is synchronized by the enable signal (EN) and is connected between the output terminal of the bootstrap circuit 110 and the gate electrode of the PMOS transistor P2a.

Furthermore, the voltage drop unit 530a includes a resistor R4a and a NMOS transistor N2a both of which are serially connected between the output terminal of the bootstrap circuit 110 and the ground terminal (Vss), and a level shifter LSH4a for turning on the NMOS transistor N2a. In other words, the resistor R4a is connected between the output terminal of the bootstrap circuit 110 and the NMOS transistor N2a. The NMOS transistor N2a is connected between the resistor R4a and the ground terminal (Vss) and is turned on by the level shifter LSH4a. The level shifter LSH4 is synchronized by the clamp signal bar (clamp1_b) being a result of the clamp signal (clamp1) that is inverted by the inverter INV4a, and is connected between the bootstrap circuit 110 and the gate electrode of the NMOS transistor N2a. At this time, it should be noted that the resistor R4a is not a necessarily required component but may be omitted.

As shown in FIG. 4 and FIG. 5, in the voltage divider 410a of the first clamp circuit 130a according to the first embodiment, the resistor R1a and the resistor R2a are serially connected in order to divide the boosting voltage (Vboot) and thus output the divided voltage (VDIVa). However, in the voltage divider 510a of the second clamp circuit 130b of the second embodiment, the capacitor C1a and the capacitor C2a are serially connected. This is because current consumption of the resistor element is larger than that of the capacitor element in view of its characteristic. In order to minimize current consumption, it is preferred that the capacitor device is used. Meanwhile, the resistor device and the capacitor device may be serially connected.

Furthermore, in order to independently drive the clamp circuits 130a and 130c depending on the amount of the boosting voltage (Vboot), the values of the resistors R1a and R2a or the capacitors C1a and C2a included in the voltage dividers 410a~410c or 510a~510c in each of the clamp circuits 130a and 130c may be differently set. For example, the values of the resistors R1a and R2a or the capacitors C1a and C2a may be set in order for the clamp circuits 130a~130c to independently operate depending on the boosting voltage (Vboot), as in Table 2 below.

TABLE 2

| Boosting Voltage (Vboot) | Clamp Circuit1 | Clamp Circuit2 | Clamp Circuit3 |
|---|---|---|---|
| Vboot ≧ 8 V | ON | ON | ON |
| 8 V > Vboot ≧ 7 V | OFF | ON | ON |
| 7 V > Vboot ≧ 6 V | OFF | OFF | ON |

As in Table 2, the values of the resistors R1a and R2a or the capacitors C1a and C2a of each of the clamp circuits 130a~130c are set, so that when the boosting voltage (Vboot) is over 8V, all the clamp circuits 130a~130c are driven (ON), when the boosting voltage (Vboot) is 8V>Vboot≧7V, only the second clamp circuit 130b and the third clamp circuit 130c of the clamp circuits 130a~130c are driven (ON), and when the boosting voltage (Vboot) is 7V>Vboot≧6V, only the third clamp circuit 130c of the clamp circuits 130a~130c is driven (ON). At this time, driving (ON) of the clamp circuits 130a~130c means that the boosting voltage (Vboot) is passed to the ground terminal (Vss) through the NMOS transistors N1a of the voltage drop units 430a ~430c, so that the boosting voltage (Vboot) is dropped.

Meanwhile, both the level shifter and the level shifter LSH1a and LSH2a shown in FIG. 4 operate as an inverting level shifter and have the same construction. A detailed construction of the level shifter and the level shifter will be described by reference to FIG. 6.

Figure 6:
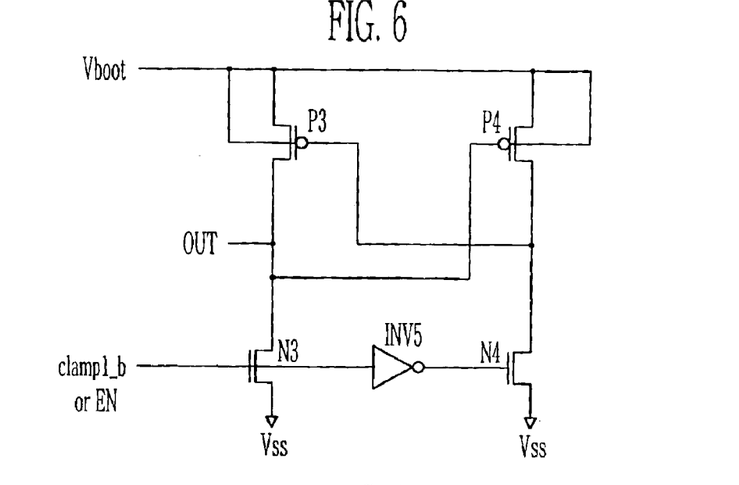
FIG. 6 is a detailed circuit diagram of the level shifters shown in FIG. 4 and FIG. 5.

Referring to FIG. 6, each of the level shifter and the level shifter LSH1a and LSH2a includes a PMOS transistor P3 and a NMOS transistor N3, and a PMOS transistor P4 and an NMOS transistor N4, which are serially connected between the output terminal of the bootstrap circuit (see '110' in FIG. 1) and the ground terminal (Vss), respectively. In other words, the level shifter LSH1a is synchronized by the enable signal (EN) to output the inverse signal of the enable signal (EN) to the gate electrode of the PMOS transistor P1. Further, the level shifter LSH2a is synchronized by the clamp signal bar (clamp1_b) to output the inverse signal of the clamp signal bar (clamp1_b) to the gate electrode of the NMOS transistor N1.

In more detail, the PMOS transistor P3 is connected between the output terminal of the bootstrap circuit 110 and the NMOS transistor N3 (or the output terminal OUT) and is turned on by the boosting voltage (Vboot). The NMOS transistor N3 is connected between the output terminal OUT and the ground terminal (Vss) and is turned on by the clamp signal bar (clamp1_b) or the enable signal (EN). The PMOS transistor P4 is connected between the output terminal of the bootstrap circuit 110 and the NMOS transistor N4 and is turned on the potential of the output terminal OUT. The NMOS transistor N4 is connected between the PMOS transistor P4 and the ground terminal (Vss) and is tuned on by the clamp signal bar (clamp1_b) or the enable signal (EN) being a result that is inverted by the inverter INV5 to transmit the ground voltage to the output terminal OUT.

Figure 7:
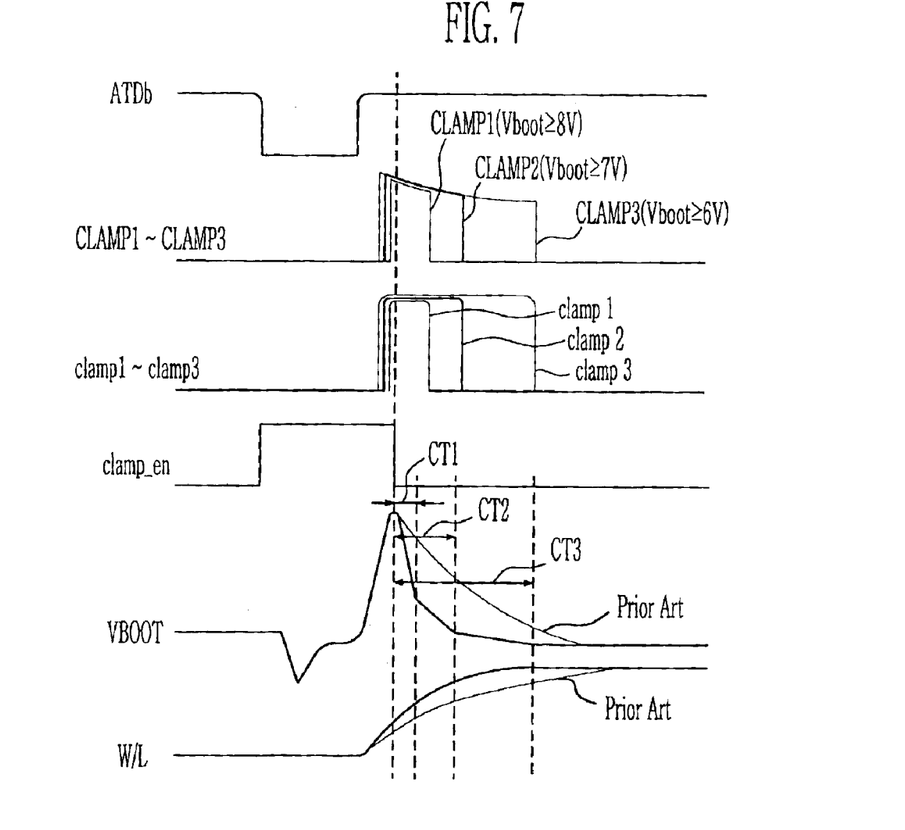
FIG. 7 shows a waveform for explaining the operating characteristics of the boosting circuit shown in FIG. 1 and FIG. 2.
Figure 8:
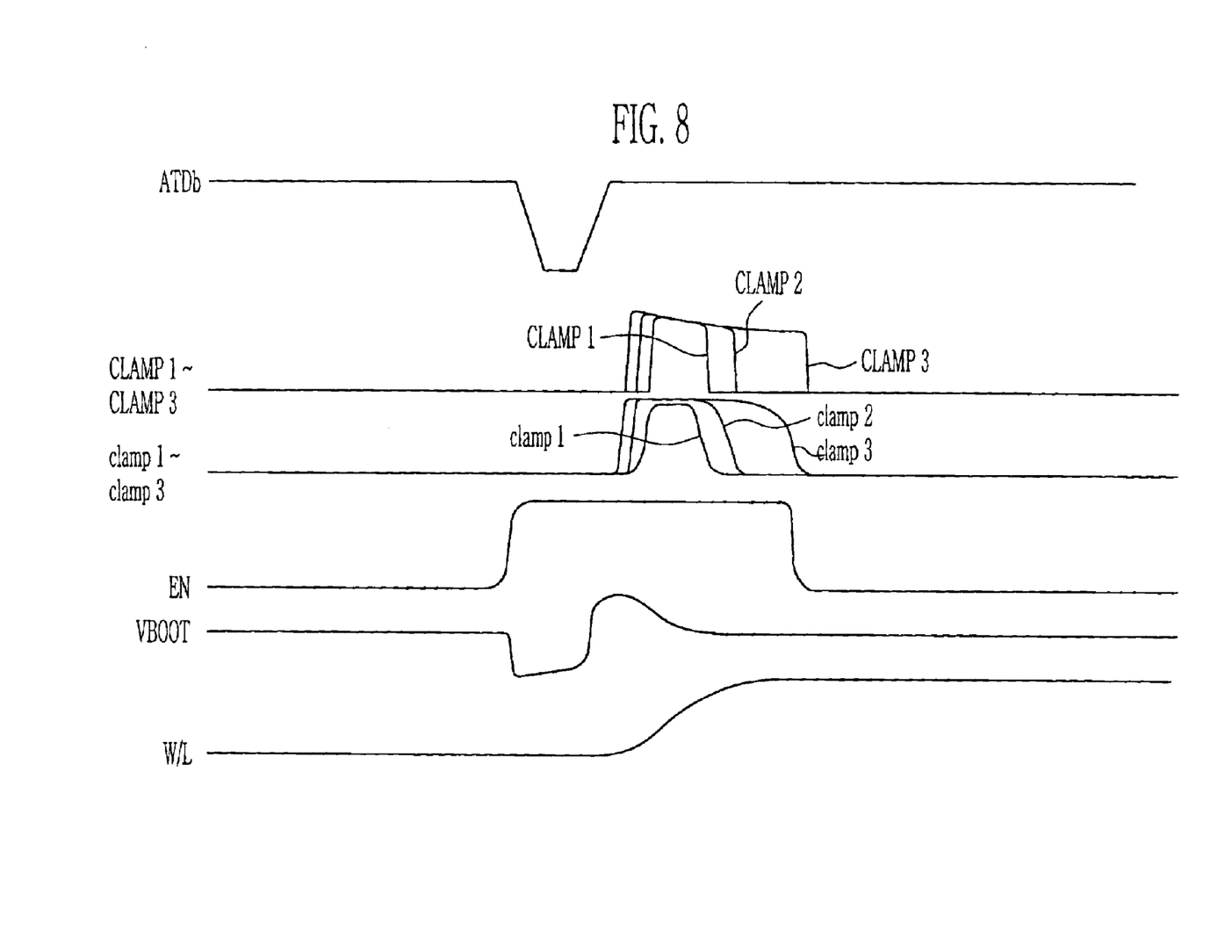
FIG. 8 shows a waveform of simulation result of the boosting circuit corresponding to the waveform shown in FIG. 7.

Hereinafter, one example of an operating characteristic of the boosting circuit according to the preferred embodiment of the present invention will be described in detail by reference to FIG. 7 and FIG. 8. FIG. 7 shows a waveform of input/output signals (clamp_en, VBOOT, clamp1, clamp2, clamp3, etc.) of the boosting circuit, and FIG. 8 shows a waveform of simulation result of each of the signals shown in FIG. 7.

For example, the values of the resistors R1a~R1c and the resistors R2a~R2c in the voltage dividers 410a~410c are set, so that when the boosting voltage (Vboot) is outputted over 8V, all the divided voltages (VDIVa~VDIVc) are divided to be higher than the reference voltage (Vref), when the boosting voltage (Vboot) is outputted as 8V>Vboot≧7V, other divided voltages (VDIVb and VDIVc) except for the divided voltage (VDIVa) of the divided voltages (VDIVa~VDIVc) are divided to be higher than the reference voltage (Vref), and when the boosting voltage (Vboot) is outputted as 7V>Vboot≧6V, only the divided voltage (VDIVc) of the divided voltages (VDIVa~VDIVc) is divided to be higher than the reference voltage (Vref).

For example, the operating characteristics of the clamp circuits 130a ~130c when the boosting voltage (Vboot) is outputted over 8V will be described by reference to FIG. 1~FIG. 8.

Referring to FIG. 1~FIG. 8, in a state wherein the address transition detection signal bar (ATDb) for detecting an address of a corresponding read memory cell is activated, i.e., shifted to a HIGH state, if the enable signal (EN) of a HIGH state is inputted to the level shifters LSH1a~LHS1c, the level shifters LSH1a~LHS1c are all driven by the enable signal (EN) of the HIGH state. The level shifters LSH1a~LHS1c driven by the enable signal (EN) of the HIGH state output the ground voltages of a LOW state, respectively, to the gate electrodes of the PMOS transistors P1a, P1b and P1c connected at the rear end of each of the level shifters LSH1a~LHS1c.

Next, all the PMOS transistor P1a, P1b or P1c are turned on by the ground voltages of the LOW state to transmit the boosting voltage (Vboot) to the resistors R1a ~R1c and the resistors R2a~R2c, respectively. The boosting voltages (Vboot) transmitted to the resistors R1a~R1c and the resistors R2a~R2c are then divided by a given ratio (for example, differently set every the clamp circuit). Accordingly, the divided voltages (VDIVa~VDIVc) having different amounts of the voltages are outputted to corresponding comparators 420a, 420b and 420c, respectively. At this time, the comparators 420a~420c compare the divided voltages (VDIVa, VDIVb and VDIVc) with the reference voltage (Vref) outputted from the reference voltage generator 120, respectively. As the result of the comparison, if the divided voltage is higher than the reference voltage (Vref), the comparators 420a~420c output the clamp signals (clamp1, clmap2 or clamp3) of a HIGH state to the inverter INV3a, INV3b or INV3c, respectively. At this time, as the boosting voltage (Vboot) is outputted over 8V, each of the divided voltages (VDIVa~VDIVc) outputted from the respective voltage dividers 410a~410c is divided to be higher than the reference voltage (Vref).

Hereinafter, the clamp signals (clamp 1, clamp2 and clamp3) each outputted from the comparators 420a~420c are inverted (i.e., become the clamp signal bars (clamp1_b~clamp3_b) of a LOW state) through the inverter INV3a, INV3b and INV3c and are then outputted to the level shifters LSH2a~LSH2c of the voltage drop units 430a~430c, respectively. Then, the level shifters LSH2a~LSH2c shift the inputted clamp signal bars (clamp1_b~clamp3_b) of the LOW state to a HIGH state (i.e., over 8V corresponding to the boosting voltage) to output the voltage drop control signals (CLAMP1, CLAMP2 and CLAMP3) being the driving signals of the NMOS transistor N1a, N1b or N1c, respectively.

Next, the NMOS transistors N1a, N1a and N1c of the voltage drop units 430a~430c are turned on by the voltage drop control signals (CLAMP1, CLAMP2 and CLAMP3) of the HIGH state, respectively. The boosting voltage (Vboot) is transmitted to the ground terminal (Vss) through the resistors R3a~R3c and the NMOS transistors N1a~N1c, so that the boosting voltage is dropped. Thus, the word line voltage (VBOOT) is abruptly dropped within a clamping time (CT1) as indicated by 'A' in FIG. 7. In other words, if the boosting voltage (Vboot) is output as over 8V through the bootstrap circuit 110, all the clamp circuits 130a~130c constituting the clamp circuit unit 130 are driven to form a current pass path between the output terminal of the bootstrap circuit 110 and the ground terminal (Vss). Accordingly, the boosting voltage (Vboot) is dropped within the time (CT1) so that a rapid and stable word line voltage (VBOOT) can be obtained.

As another example, the operating characteristics of the clamp circuits 130a~130c when the boosting voltage (Vboot) is outputted as 8V>Vboot≧7V, will be described by reference to FIG. 1~FIG. 8.

Referring to FIG. 1~FIG. 8, in a state wherein the address transition detection signal bar (ATDb) for detecting an address of a corresponding read memory cell is activated, i.e., shifted to a HIGH state, if the enable signal (EN) of a HIGH state is inputted to the level shifters LSH1a~LHS1c, all the level shifters LSH1a~LHS1c are driven by the enable signal (EN) of the HIGH state. The level shifters LSH1a~LHS1c driven by the enable signal (EN) of the HIGH state output the ground voltages of a LOW state, respectively, to the gate electrodes of the PMOS transistors P1a, P1b and P1c connected at the rear end of each of the level shifters LSH1a~LHS1c.

Thereafter, all the PMOS transistors P1a, P1b and P1c are turned on by the ground voltages of the LOW state to transmit the boosting voltages (Vboot) to the resistors R1a~R1c and the resistors R2a~R2c, respectively. The boosting voltages (Vboot) transmitted to the resistors R1a~R1c and the resistors R2a~R2c are then divided by a given ratio. Accordingly, the divided voltages (VDIVa~VDIVc) having different amounts of the voltages are outputted to corresponding comparators 420a, 420b and 420c, respectively. The comparators 420a~420c compare the divided voltages (VDIVa, VDIVb and VDIVc) with the reference voltage (Vref) outputted from the reference voltage generator 120, respectively. As the result of the comparison, if the divided voltage is higher than the reference voltage (Vref), the comparators 420a~420c output the clamp signals (clamp1, clmap2 and clamp3) of a HIGH state to the inverters INV3a, INV3b and INV3c, respectively. At this time, if the boosting voltage (Vboot) is outputted as 8V>Vboot≧7V, the divided voltage (VDIVa) that is divided in the voltage divider 410a, of the divided voltages (VDIVa~VDIVc) each outputted from the voltage dividers 410a~410c is divided into a voltage lower than the reference voltage (Vref). Other divided voltages (VDIVb and VDIVc) are divided into a voltage higher than the reference voltage (Vref). Accordingly, the comparator 420a outputs the clamp signal (clamp1) of a LOW state, while other comparators 420b and 420c output the clamp signals (clamp2 and clamp3) of a HIGH state, respectively.

Next, the clamp signal (clamp1) outputted from the comparator 420a is shifted to a HIGH state through the inverter INV3a and is then outputted to the level shifter LSH2a. The clamp signals (clamp2 and clamp3) outputted from other comparators 420b and 420c are shifted to a LOW state through the inverters INV3b and INV3c and are then outputted to the level shifters LSH2b and LSH2c, respectively. The level shifter LSH2a shifts the inputted clamp signal bar(clamp1_b) of the HIGH state to a LOW state (i.e., ground voltage) to output the voltage drop control signal (CLAMP1) being a driving signal of the NMOS transistor N1a. Also, the level shifters LSH2b and LSH2c shift the inputted clamp signal bars (clamp2_b and clamp3_b) of the LOW state to a HIGH state (i.e., voltage corresponding to the boosting voltage) to output the voltage drop control signals (CLAMP2 and CLAMP3) being a driving signal of the NMOS transistors N1b and N1c.

Thereafter, the NMOS transistor N1a is turned off by the voltage drop control signal (CLAMP1) of the LOW state, and the NMOS transistors N1b and N1c are turned on by the voltage drop control signals (CLAMP2 and CLAMP3 of the HIGH state, respectively. Accordingly, the boosting voltage (Vboot) is passed to the ground terminal (Vss) through the output terminal of the bootstrap circuit 110 and the resistors R3b and R3c and the NMOS transistors N1b and N1c of the clamp circuits 130b and 130c, so that the boosting voltage (Vboot) is dropped. Thus, the word line voltage (VBOOT) is dropped within a clamping time (CT2) as indicated in FIG. 7.

In other words, if the boosting voltage (Vboot) is outputted ad 8V>Vboot≧7V through the bootstrap circuit 110, only the clamp circuits 130b and 130c of the clamp circuits 130a~130c constituting the clamp circuit unit 130a are driven to form a current pass path between the output terminal of the bootstrap circuit 110 and the ground terminal (Vss), thus dropping the boosting voltage (Vboot) within the clamping time (CT2). Thus, a stabilized word line voltage (VBOOT) can be obtained.

As another example, the operating characteristics of the clamp circuits 130a~130c when the boosting voltage (Vboot) is outputted as 7V>Vboot≧6V will be described by reference to FIG. 1~FIG. 8.

Referring to FIG. 1~FIG. 8, in a state wherein the address transition detection signal bar (ATDb) for detecting an address of a corresponding read memory cell is activated, i.e., shifted to a HIGH state, if the enable signal (EN) of a HIGH state is inputted to the level shifters LSH1a~LHS1c, all the level shifters LSH1a~LHS1c are driven by the enable signal (EN) of the HIGH state. The level shifters LSH1a~LHS1c driven by the enable signal (EN) of the HIGH state output the ground voltages of a LOW state, respectively, to the gate electrodes of the PMOS transistors P1a, P1b and P1c connected at the rear end of each of the level shifters LSH1a~LHS1c.

Thereafter, all the PMOS transistors P1a, P1b and P1c are turned on by the ground voltages of the LOW state to transmit the boosting voltages (Vboot) to the resistors R1a~R1c and the resistors R2a~R2c, respectively.

The boosting voltages (Vboot) transmitted to the resistors R1a~R1c and the resistors R2a~R2c are then divided by a given ratio. Accordingly, the divided voltages (VDIVa~VDIVc) having different amounts of the voltages are outputted to corresponding comparators 420a, 420b and 420c, respectively.

The comparators 420a~420c compare the divided voltages (VDIVa, VDIVb and VDIVc) with the reference voltage (Vref) outputted from the reference voltage generator 120, respectively. As the result of the comparison, if the divided voltage is higher than the reference voltage (Vref, the comparators 420a~420c output the clamp signals (clamp1, clmap2 and clamp3) of a HIGH state to the inverters INV3a, INV3b and INV3c, respectively. At this time, if the boosting voltage (Vboot) is outputted as 7V>Vboot≧6V, the divided voltages (VDIVa and VDIVb) that are divided in the voltage dividers 410a and 410b, of the divided voltages (VDIVa~VDIVc) each outputted from the voltage dividers 410a~410c are divided into a voltage lower than the reference voltage (Vref). The remaining divided voltage (VDIVc) is divided into a voltage higher than the reference voltage (Vref). Accordingly, the comparator 420a and 420b output the clamp signals (clamp1 and clamp2) of a LOW state, respectively, while the comparator 420c outputs the clamp signal (clamp3) of a HIGH state.

Next, the clamp signals (clamp1 and clamps) outputted from the comparators 420a and 420b are shifted to HIGH states through the inverters INV3a and INV3b and are then outputted to the level shifters LSH2a and LSH2b, respectively. The clamp signal (clamp3) outputted from other comparator 420c is shifted to a LOW state through the inverter INV3c and is then outputted to the level shifter LSH2c. The level shifters LSH2a and LSH2b shift the inputted clamp signal bars(clamp1_b and clamp2_b) of the HIGH state to LOW states (i.e., ground voltage) to output the voltage drop control signals (CLAMP1 and CLAMP2) being driving signals of the NMOS transistors N1a and N1b, respectively. Also, the level shifter LSH2c shifts the inputted clamp signal bar (clamp3_b) of the LOW state to a HIGH state (i.e., voltage corresponding to the boosting voltage) to output the voltage drop control signal (CLAMP3) being a driving signal of the NMOS transistor N1c.

Thereafter, the NMOS transistors N1a and N1b are turned off by the voltage drop control signals (CLAMP1 and CLAMP2) of the LOW states, respectively, and the NMOS transistor N1c is turned on by the voltage drop control signal (CLAMP3 of the HIGH state. Accordingly, the boosting voltage (Vboot) is passed to the ground terminal (Vss) through the output terminal of the bootstrap circuit 110, and the resistor R3c and the NMOS transistor N1c of the clamp circuit 130c, so that the boosting voltage (Vboot) is dropped. Thus, the word line voltage (VBOOT) is dropped within a clamping time (CT3) as indicated in FIG. 7.

In other words, if the boosting voltage (Vboot) is outputted ad 7V>Vboot≧6V through the bootstrap circuit 110, only the clamp circuit 130c of the clamp circuits 130a~130c constituting the clamp circuit unit 130a is driven to form a current pass path between the output terminal of the bootstrap circuit 110 and the ground terminal (Vss), thus dropping the boosting voltage (Vboot) within the clamping time (CT3). As a result, a stabilized word line voltage (VBOOT) can be obtained.

In view of the above embodiments, according to the present invention, the clamp circuit unit 130 consists of at least one or more clamp circuit and at least one of the clamp circuits is independently driven in a desired sensing period in order to drop the boosting voltage (Vboot). Also, when the low-potential power supply voltage (LVcc) is applied, i.e., when sensing is not performed, the voltage divider is not driven through the clamp enable signal (clamp_en). Thus, current consumption that inevitably occurs in the prior art can be prevented. Further, a under shoot phenomenon occurring at the 'A' shown in FIG. 12 can be prevented. Also, the clamping time (CT) (time same to CT3 in FIG. 7) can be significantly shortened (see 'CT1 and CT2' in FIG. 7). To Meanwhile, in FIG. 12, the voltage drop control signal (CLMAP) corresponds to the voltage drop control signal (CLAMP3) in FIG. 7. The shown clamp signal (clamp) corresponds to the clamp signal (clamp3) in FIG. 7. Therefore, the present invention can generate the word line voltage (VBOOT) that is stable and has a rapid read access time compared to the prior art and stably obtain the voltage (W/L) applied to the word line.

As mentioned above, according to the present invention, in order to drop a boosting voltage to a target word line voltage, a clamp circuit unit consists of at least one or more clamp circuit and at least one or more of the clamp circuits are independently driven in a desired sensing period. Therefore, the present invention has advantageous effects that it can allow rapid read access time upon a data read operation, minimize current consumption and obtain a stabilized word line voltage.

In the present invention, it was described that the clamp circuit unit includes three clamp circuits. However, the number of the clamp circuit may be changed depending on situation upon design.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A boosting circuit, comprising:
   a bootstrap circuit for boosting a first voltage to output a second voltage;
   a reference voltage generator for generating a reference voltage; and
   a clamp circuit unit including at least one clamp circuit, said clamp circuit comparing the second voltage and the reference voltage and, depending on a result of the comparison, said clamp circuit being driven to drop the second voltage to a target voltage, said clamp circuit including.
   a voltage divider receiving the second voltage, for dividing the second voltage;
   a comparator receiving the reference voltage, for comparing the reference voltage and a divided voltage that is divided in the voltage divider, wherein when the divided voltage is higher than the reference voltage, the comparator outputs a first signal, and when the divided voltage is lower than the reference voltage, the comparator outputs a second signal having an opposite phase to the first signal; and
   a voltage drop unit for dropping the second voltage to the target voltage, wherein the voltage drop unit is driven by the first signal; and
   said voltage divider including,
   a level shifter circuit for inverting the second voltage according to an enable signal;
   a transistor driven by an output signal of the level shifter circuit, for transmitting the second voltage; and
   a dividing means for dividing the second voltage outputted from the transistor.

2. The boosting circuit as claimed in claim 1, wherein said dividing means is for generating divided voltage having different amounts.

3. The boosting circuit as claimed in claim 1, wherein the dividing means includes at least two resistors or at least two capacitors, which are serially connected.

4. The boosting circuit as claimed in claim 1, wherein the enable signal is generated through a logical combining unit for logically combining clamp signals outputted from comparators of each clamp circuits, and the enable signal enabling the clamp circuit unit.

5. The boosting circuit as claimed in claim 4, wherein the logical combining unit comprises:
   a NOR gate for performing a negation logical sum of the clamp signals and the enable signal; and
   an inverter for inverting an output of the NOR gate.

6. The boosting circuit as claimed in claim 1, wherein the comparator is driven by an enable bar signal that is an inverted signal of the enable signal for driving the voltage divider of said clamp circuit.

7. A boosting circuit, comprising:
   a bootstrap circuit for boosting a first voltage to output a second voltage;
   a reference voltage generator for generating a reference voltage;
   a clamp circuit unit having a plurality of clamp circuits for dropping the second voltage over at least two steps, each clamp circuit including,
   a voltage divider for generating a divided voltage by dividing the second voltage;
   a compare unit for comparing the divided voltage with the reference; and
   a voltage drop unit for dropping the second voltage according to a comparison result of the compare unit.

8. The boosting circuit as claimed in claim 7, wherein the clamp circuit unit includes:
   a first clamp circuit for dropping the second voltage when the second voltage is over a first predetermined voltage level;
   a second clamp circuit for dropping the second voltage when the second voltage is over a second predetermined voltage level that is lower than the first predetermined voltage level; and
   a third clamp circuit for dropping the second voltage when the second voltage is over a third predetermined voltage level that is lower than the second predetermined voltage level.

9. The boosting circuit as claimed in claim 7, wherein the voltage divider includes:
   a level shifter circuit for inverting the second voltage according to an enable signal;
   a transistor driven by an output signal of the level shifter circuit, for transmitting the second voltage; and
   a dividing means for dividing the second voltage outputted from the transistor.

10. The boosting circuit as claimed in claim 9, wherein the dividing means includes at least two resistors or two capacitors, each connected in series with each other.

11. The boosting circuit as claimed in claim 9, wherein the enable signal is generated through a logical combining unit for logically combining clamp signals outputted from comparators of the first, second and third clamp circuits, and the enable signal enabling the clamp circuit unit.

12. The boosting circuit as claimed in claim 11, wherein the logical combining unit includes:
    a NOR gate for performing a negation logical sum of the clamp signals and the enable signal; and
    an inverter for inverting an output of the NOR gate.

13. A boosting circuit, comprising:
    a bootstrap circuit for boosting a first voltage to output a second voltage;
    a reference voltage generator for generating a reference voltage; and
    a clamp circuit unit including at least one clamp circuit, each clamp circuit comparing the second voltage and the reference voltage and, depending on a result of the comparison, at least one of the clamp circuits is driven to drop the second voltage to a target voltage, said clamp circuit including,
    a voltage divider receiving and dividing the second voltage, said voltage divider being driven by an enable signal;
    a comparator receiving the reference voltage, for comparing the reference voltage and a divided voltage that is divided in the voltage divider, wherein when the divided voltage is higher than the reference voltage, the comparator outputs a first signal, and when the divided voltage is lower than the reference voltage, the comparator outputs a second signal having an opposite phase to the first signal, said comparator being driven by an enable bar signal that is an inverted signal of the enable signal for driving the voltage divider; and
    a voltage drop unit for dropping the second voltage to the target voltage, said voltage drop unit being driven by the first signal.

* * * * *